United States Patent
Eskildsen

(10) Patent No.: US 7,636,579 B2
(45) Date of Patent: Dec. 22, 2009

(54) MULTI-FREQUENCY WIRELESS TRANSMITTER

(75) Inventor: Kenneth G. Eskildsen, Great Neck, NY (US)

(73) Assignee: Honeywell International Inc., Morristown, NJ (US)

( * ) Notice: Subject to any disclaimer, the term of this patent is extended or adjusted under 35 U.S.C. 154(b) by 762 days.

(21) Appl. No.: 11/281,199

(22) Filed: Nov. 16, 2005

(65) Prior Publication Data

US 2007/0110181 A1    May 17, 2007

(51) Int. Cl.
*H04B 7/00* (2006.01)
*H04B 1/04* (2006.01)

(52) U.S. Cl. ............... 455/500; 455/103; 455/41.2

(58) Field of Classification Search ........... 455/41.2, 455/500, 91, 95, 101, 103, 113, 127.1, 127.5, 455/422.1
See application file for complete search history.

(56) References Cited

U.S. PATENT DOCUMENTS

| | | | | |
|---|---|---|---|---|
| 4,184,117 A | * | 1/1980 | Lindner | 380/34 |
| 5,181,246 A | * | 1/1993 | Miki | 380/34 |
| 5,553,860 A | * | 9/1996 | Zelikovich | 473/455 |
| 6,002,925 A | * | 12/1999 | Vu et al. | 455/313 |
| 6,560,445 B1 | * | 5/2003 | Fette et al. | 455/91 |
| 6,850,765 B2 | * | 2/2005 | Wasko | 455/450 |
| 7,176,784 B2 | * | 2/2007 | Gilbert et al. | 340/10.34 |
| 2006/0109078 A1 | | 5/2006 | Keller, Jr. et al. | |
| 2006/0109079 A1 | | 5/2006 | Mack | |

* cited by examiner

*Primary Examiner*—Sonny Trinh
(74) *Attorney, Agent, or Firm*—Husch Blackwell Sanders Welsh & Katz

(57) ABSTRACT

A multi-frequency wireless transmitter is provided for use in automated security systems. The multi-frequency wireless transmitter transmits a message over a plurality of frequencies, thus diminishing the effects of noise interference. The transmitter includes a frequency generator capable of selectably generating a plurality of frequencies lying within the 260 to 470 MHz frequency band. An RF power amplifier having multiple power output values selectable to match with the selected generated frequency regulates the transmit power.

15 Claims, 5 Drawing Sheets

MULTI-FREQUENCY WIRELESS TRANSMITTER

I. BACKGROUND OF THE INVENTION

The present invention relates generally to security systems used in residential, commercial, industrial and government applications. More specifically, the present invention provides an FCC Part 15 compliant multi-frequency wireless transmitter for use in security systems.

Security systems have steadily increased in complexity over the years, beginning with the simple lock to the modern electronic security systems. Current security systems are not only designed to protect a home or commercial property from unauthorized intrusion but also to provide status of environmental conditions, such as temperature, air quality, fire warnings, carbon monoxide warnings, etc. Such systems include a myriad collection of sensors ranging from video cameras, infrared sensors, motion detectors, pressure sensors, temperature sensors, smoke detectors, and various air quality sensors. These sensors are distributed throughout a property and usually linked to a centralized security monitoring system.

These sensors are in communication with the monitoring system by various methods. Hard wiring is the most common means, wherein the sensors are physically wired to the monitoring system. However, hard wiring numerous sensors can be daunting when the security system is being installed in an already established site. Such wiring would necessitate cutting through walls to pass the wires from the individual sensors to the monitoring system.

This problem, for the most part, has been overcome with the advent of wireless communication technologies utilizing Radio Frequency (RF). RF frequencies generally extend from about 9 KHz to well over 100 GHz in the electromagnetic spectrum—frequencies above 3 GHz are generally referred to as microwave spectrum. The RF range of frequencies includes bands used for broadcast television (VHF, UHF), cordless phones (MHz-GHz range), cellular phones (GHz), wireless networking, remote control devices, etc. Usage of RF bandwidth is, largely, regulated by the FCC to ensure safe and interference-free operation.

The RF band of particular interest for communication between sensors and a monitoring system are in the 260 MHz to 470 MHz range. These frequency bands are regulated by Part 15 of the FCC Regulations, specifically 47 C.F.R. § 15.231. Under the Part 15 rules, these RF bands are available to the public without any licensing requirements, however there are strict guidelines that must be followed nonetheless. For example, power output must not exceed certain limits which are dependent on the specific broadcast frequency—e.g., for a frequency of 260 MHz, the radiated field strength shall not exceed 3,750 µV/m, while for a frequency of 470 MHz the radiated field strength shall not exceed 12,500 µV/m. The radiated field strength for the remaining frequencies lying between 260 MHz and 470 MHz can be calculated by interpolation. The complete rules governing the use of these frequency bands are available in 47 C.F.R. Part 15 published by the U.S. Government Printing Office.

RF transmitters incorporated into security system sensors and remote activation devices transmit in one of two ways. The simplest transmission method employs a single frequency as a carrier frequency. However, single frequency transmission is susceptible to interference from background noise produced by other RF devices.

An alternative transmission method relies on what is called frequency hopping, also known as spread spectrum. In frequency hopping, many frequencies are used to transmit a signal. While frequency hopping offers more reliability over single frequency, frequency hopping is more complex and costly to implement. The basic idea behind frequency hopping is simple—instead of transmitting on one frequency, a frequency hopping system switches rapidly from one frequency to the next. The choice of the next frequency is random, so it is nearly impossible for someone to eavesdrop or jam the signal. In frequency hopping, only packets containing a small portion of a message are transmitted on each frequency. However, keeping both the transmitter and receiver synchronized is the challenge, which requires accurate clocks and pseudo-random number generators.

A need exists for an RF transmitter with better reliability than single frequency RF transmitters, while still being inexpensive and relatively simple in design compared to frequency hopping RF transmitters, but yet be in compliance with FCC Part 15 regulations.

II. SUMMARY OF THE INVENTION

The present invention addresses the above-mentioned need by providing a device for wirelessly transmitting a message over multiple frequencies. The device includes means for providing a plurality of carrier frequencies, means for selecting a first carrier frequency from the plurality of carrier frequencies, and means for transmitting a signal over the selected carrier frequency using calculated parameters based on the selected carrier frequency. Additionally, the device provides a means for switching to a next carrier frequency of the plurality of carrier frequencies and means for repeating the transmitting and switching until all carrier frequencies of the plurality of carrier frequencies have been selected.

The present invention may be embodied as a multi-frequency wireless transmitter having a frequency generating means for generating a plurality of carrier frequencies, a power means for generating multiple voltage output levels, a controller means for controlling the power means, a frequency generating means, and a transmission means for transmitting a message over the selected first frequency. The multiple voltage output levels of the power means are selectable, and the controller means is configured for selecting a first frequency of the plurality of carrier frequencies. After transmission of the message over the selected first frequency, the controller selects a subsequent frequency and power level from the plurality of carrier frequencies and power levels and the transmission means transmits the message over the selected subsequent frequency. The subsequent frequency is different from the first frequency.

The present invention, additionally, may be embodied as a multi-frequency RF transmitter circuit, dimensioned as an integrated circuit (IC) package, for transmitting an RF signal complying with FCC Part 15 requirements. The transmitter circuit includes a power supply input for energizing the transmitter circuit, a data input for receiving data signals to be transmitted, at least one frequency band switch input for selecting one frequency band from a plurality of supported frequency bands, and an output for outputting an amplified RF signal, which contains the data signals, to an antenna for transmission.

Further, the present invention provides a method for wirelessly transmitting a message over multiple frequencies. The method includes providing a plurality of carrier frequencies, selecting a first carrier frequency from the plurality of carrier frequencies, transmitting a signal over the selected carrier frequency using calculated parameters based on the selected carrier frequency, switching to a next carrier frequency from the plurality of carrier frequencies, and repeating the transmitting and switching until all the carrier frequencies of the plurality of carrier frequencies have been selected.

III. BRIEF DESCRIPTION OF THE DRAWINGS

These and other features, aspects, and advantages of the present invention will become better understood with regard to the following description, appended claims, and accompanying drawings wherein:

IV. DETAILED DESCRIPTION OF INVENTION

Figure 1:
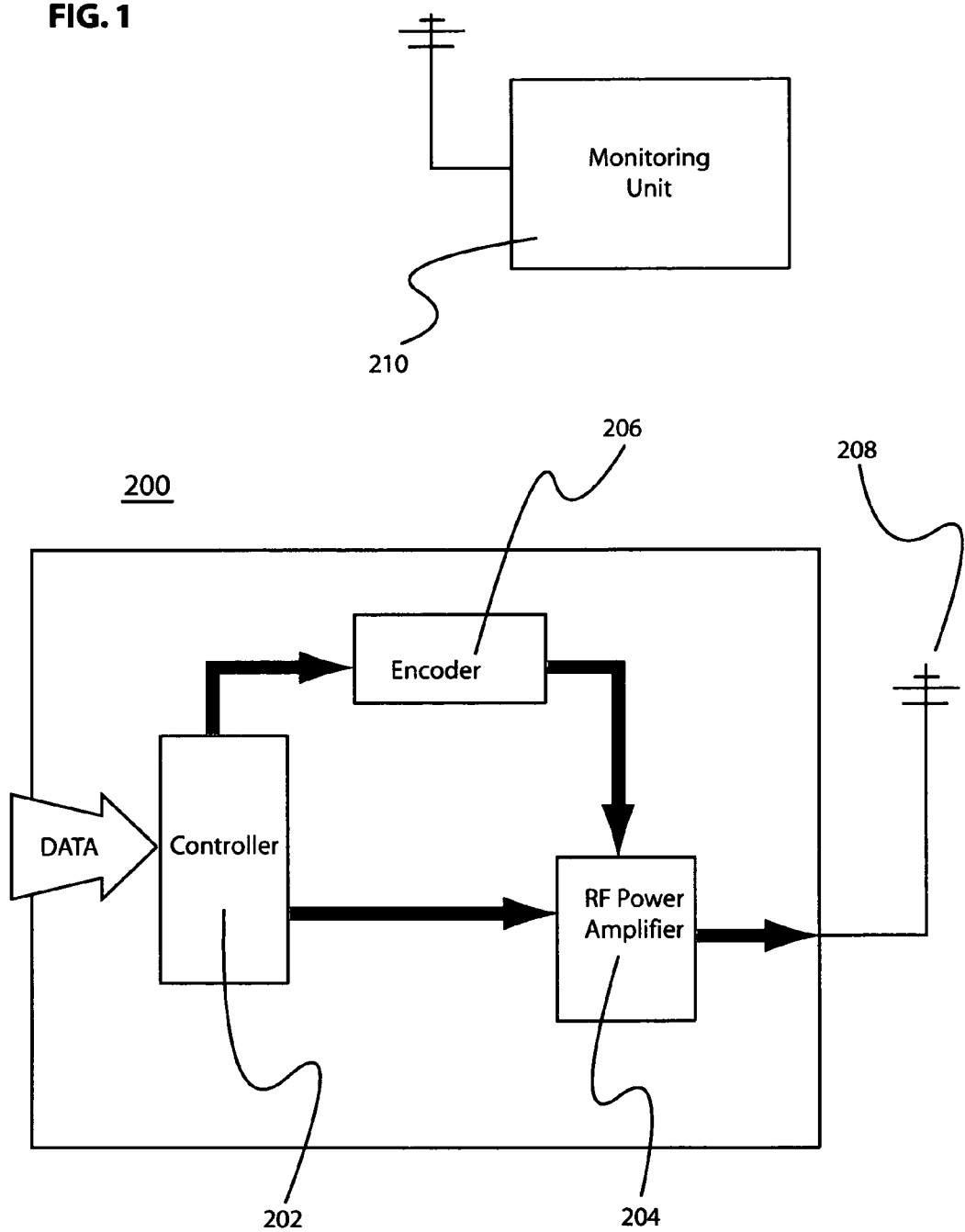
FIG. 1 shows a block diagram representation of a multi-frequency wireless transmitter in accordance with the present invention.

Referring to FIG. 1, an embodiment of the present invention having a transmitter 200, which transmits a message over a plurality of frequencies, is shown. The transmitter 200 includes a controller 202, RF power amplifier 204, a frequency generator 206 and a transmitting antenna 208.

The controller 202 is configured for receiving data from a sensor and preparing messages including sensor status to be broadcast by the frequency generator 206 through the RF power amplifier 204 and transmitting antenna 208 to a monitoring unit 210. Additionally, the controller 202 controls the RF power amplifier 204 output parameters, specifically the output power of the broadcast signal delivered to the antenna 208 and the carrier frequency produced by the frequency generator 206.

The frequency generator 206 can selectably output a plurality of carrier frequencies in the range of 260 MHz to 470 MHz, with the frequency selection being performed by the controller 202. At a minimum, two carrier frequencies are selectable, however additional carrier frequencies increase reliability.

It should be noted that, while FIG. 1 shows only one frequency generator 206, more than one frequency generator may be used to provide the plurality of carrier frequencies. In such a case, the controller is configured to select between the plurality of frequency generators by way of well-known switching circuitry.

The RF power amplifier 204 has an adjustable output power controlled by controller 202. The output power is adjusted to output a signal that meets the FCC Part 15 limits. The output power of the RF power amplifier is linearly adjustable between 3,750 µV/m, for 260 MHz, and 12,500 µV/m, for 470 MHz, such that the field strength of the carrier frequency is defined as: $E_f \leq [41.66 \, (\mu V/m)/MHz] \times \text{frequency} - 7083.33 \, (uV/m)$; where $E_f$ is the Electromagnetic field strength, and frequency is a carrier frequency between 260 MHz and 470 MHz.

It should be noted that, the RF power amplifier 204 may be formed by a plurality of RF power amplifiers, each outputting a predefined one or more power levels. In such a case, the controller is configured to select between the plurality of RF power amplifiers by way of well-known switching circuitry.

Figure 5:
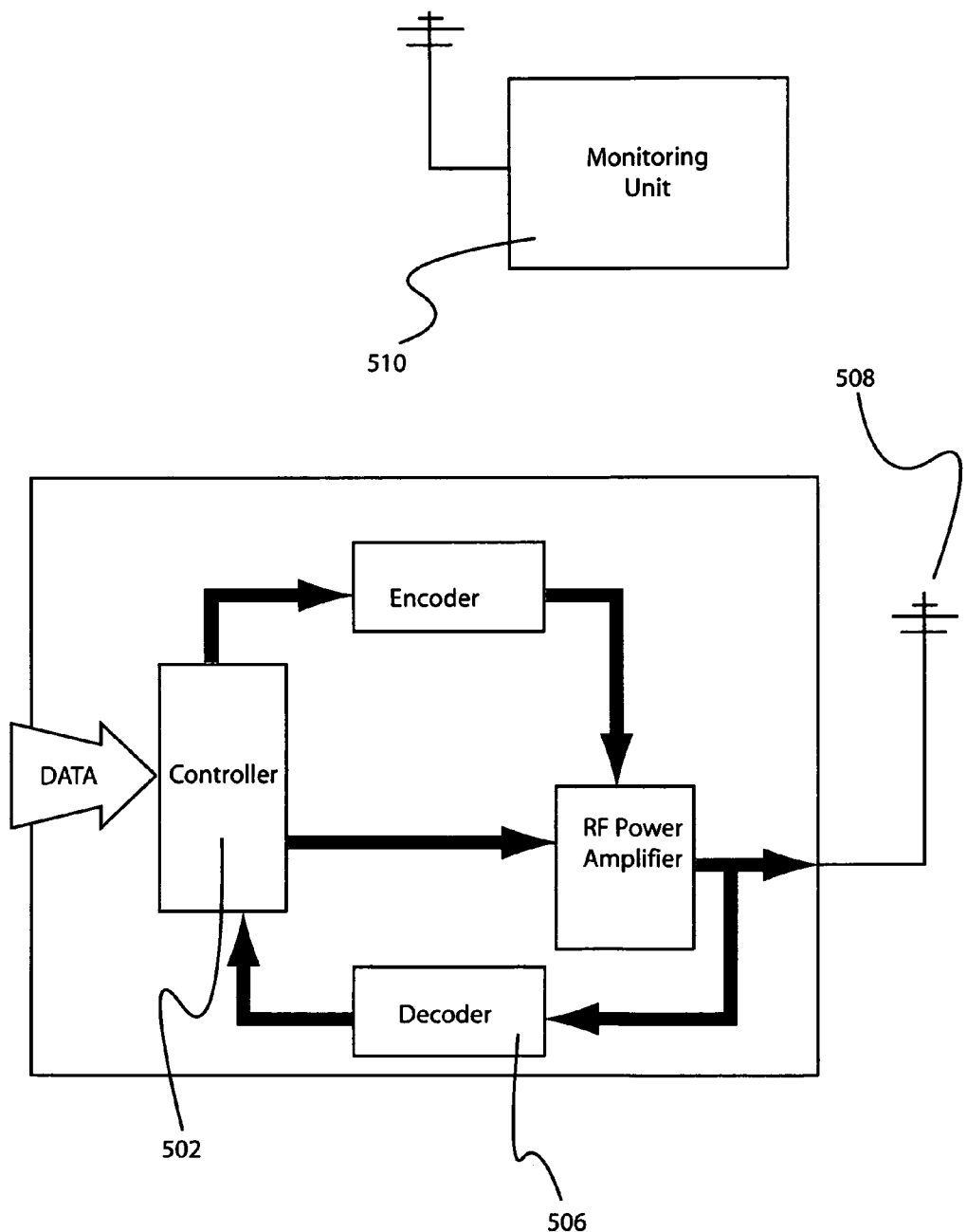
FIG. 5 shows a block diagram representation of a multi-frequency wireless transmitter and receiver in accordance with the present invention.

In another embodiment of the present invention, as shown in FIG. 5, the multi-frequency wireless transmitter may include a receiving antenna 508 configured for receiving messages transmitted by a multi-frequency wireless transmitter 510 in accordance with the present invention. In addition to the receiving antenna 508, one or more frequency decoders 506 are provided for decoding the multi-frequency transmission and separating the message from the carrier frequency. Subsequently, the controller 502 processes the message. The received message may be a polling signal requesting status of the sensor, or control signals providing operational instructions, such as for activating or deactivating a specific sensor.

Figure 2:
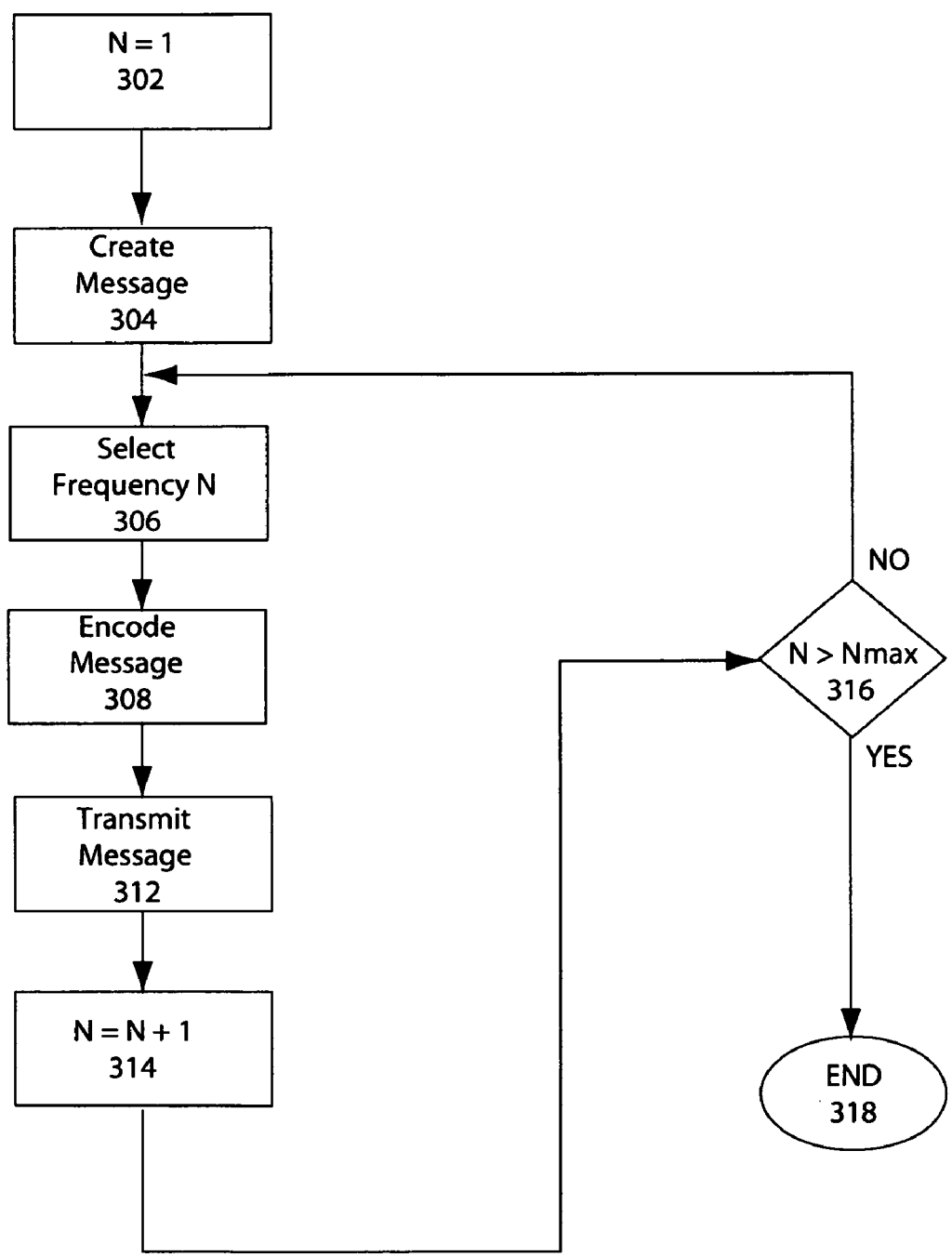
FIG. 2 is a flow diagram showing a method for transmitting a message over multiple frequencies in accordance with the present invention.

Referring to FIG. 2, a method of performing the multi-frequency transmission of messages is shown. Initially, a controller 202 receives sensor data and sets a counter n equal to 1 in step 302. The sensor data is converted into a message signal by the controller in step 304. The message signal may contain authentication headers or encryption to provide a layer of security against falsified or unauthorized messages being accepted by the monitoring unit 210.

In step 306, the controller 202 selects carrier frequency N and sets the RF power level of the switching RF power amplifier 204 to a value corresponding to the selected carrier frequency and in compliance with the FCC Part 15 limits. Next, the message signal is transmitted to a frequency generator 206, which modulates the message signal onto the selected carrier frequency N in step 308. Proceeding to step 312, the encoded signal is then transmitted from the frequency encoder 206 to the switching RF power amplifier 204, where the modulated signal is amplified by a factor equal to the pre-set RF power level. The message signal is transmitted over the selected carrier frequency N at the pre-set RF power level in step 312. The controller 202 increments the counter N to N+1 in step 314.

Proceeding to step 316, the controller 202 compares the counter n with the maximum number of available carrier frequencies, designated as $N_{max}$. If the counter n is less than or equal to $N_{max}$, then the process continues to step 306 and repeats steps 306 to 316. However, if the counter n is greater than $N_{max}$, then the process proceeds to step 318 wherein the process is terminated.

Figure 3:
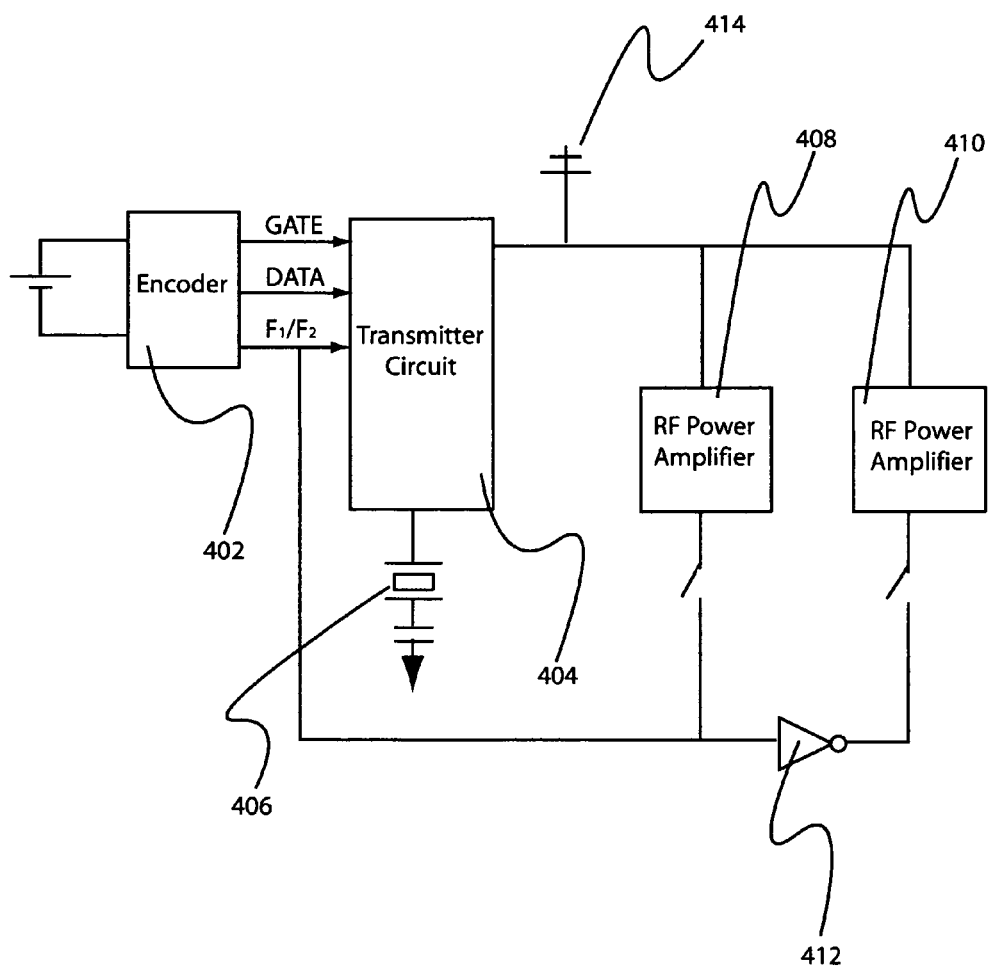
FIG. 3 shows a circuit for transmitting a message over multiple frequencies in accordance with the present invention.

Another embodiment of the present invention is shown in FIG. 3, showing a representative circuit for transmitting on two discrete frequency bands. The circuit includes an encoder 402, transmitter circuit 404, reference frequency crystal oscillator 406, a first frequency tuning circuit 408, a second frequency tuning circuit 410, an inverter 412 and an antenna 414. It should be noted that more than two frequency bands could also be supported, however a frequency tuning circuit would need to be supplied for each supported frequency band.

The encoder 402 provides three outputs: a data signal, a frequency band switch signal, and an operational voltage. The data signal contains a message for transmission to a receiver. The frequency band switch signal is configured as a binary signal, wherein logic HIGH denotes a first frequency band and logic LOW denotes a second frequency band. The operational voltage energizes the transmitter circuit 404 when a transmission is being prepared. These outputs provide the inputs to the transmitter circuit 404.

The data signal is connected to the DATA lead of the transmitter circuit 404. In cases where the multi-frequency wireless transmitter is used in security applications, the data signal may be encrypted or provide other authentication information, so that a receiving unit can verify the authenticity of the data and so that the data cannot be intercepted and decoded by non-authorized receivers. However, any data format protocol may be used.

The frequency band switch signal connects to the frequency switching lead of the transmitter circuit 404 denoted by reference "$F_1/F_2$". The transmitter circuit is not limited to only one frequency switching lead, but rather, may have any number of frequency switching leads depending on the number of supported frequency bands. For example, eight frequency bands require 3 frequency switching leads, in accordance with the following equation: $2^n=m$, where m is equal to the number of supported frequency bands and n is the number of required frequency switching leads.

Additionally, the frequency band switch signal is used to activate the appropriate frequency tuning circuit. For example, when the frequency band switch signal is logic HIGH, the signal transmits logic HIGH to the first frequency tuning circuit 408, thus activating the circuit. Simultaneously, the frequency band switch signal is transmitted through an inverter 412, which converts the signal into logic LOW thus preventing the second frequency tuning circuit 410 from activating.

When the frequency band switch signal is logic LOW, the reverse occurs. The first frequency tuning circuit 408 receives logic LOW and thus remains inactive. The inverter 412 converts the signal into logic HIGH causing the second frequency tuning circuit 410 to activate.

The properties of the activated frequency tuning circuit determine the output power of the transmission signal. A matched circuit will transmit maximum power, while a mismatched circuit will result in lower transmission power. Each frequency tuning circuit is matched to its corresponding frequency band supported by the transmitter circuit 404 and configured to provide a power output in compliance with the FCC Part 15 emissions limits for that frequency.

Figure 4:
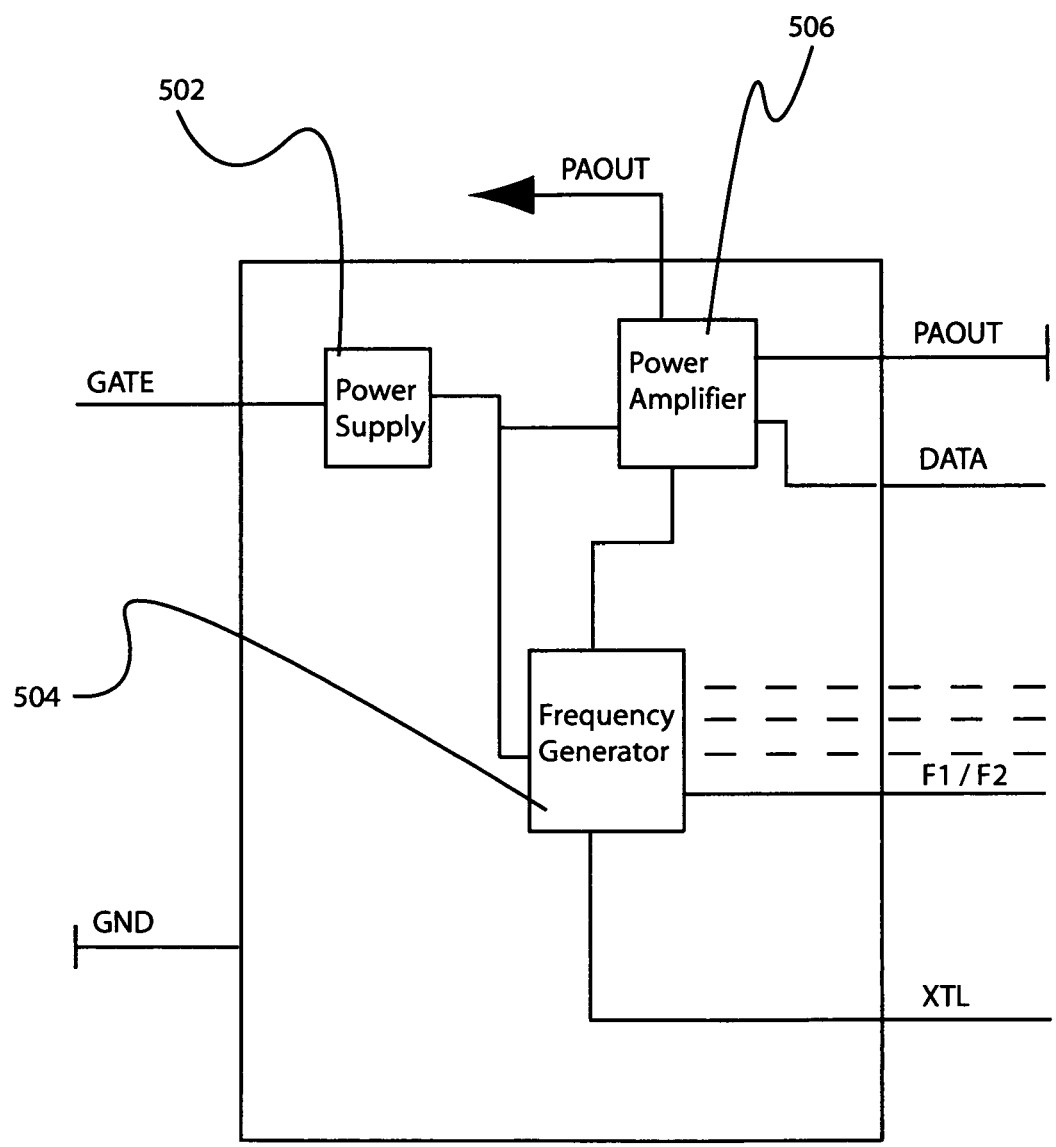
FIG. 4 is a block diagram representation of the internal components and of the transmitter circuit of FIG. 3.

The internal components of the transmitter circuit 404 are represented in block form in FIG. 4. The transmitter circuit 404, dimensioned as an integrated circuit package, provides a number of input leads and output leads. The DATA lead provides an input of a message to be transmitted.

The GATE lead energizes the transmitter circuit 404 when a message is being transmitted. Preferably, the GATE lead is open when the transmitter circuit 404 is not in use and only provides voltage to the transmitter circuit 404 when necessary, thus reducing power consumption. The GATE lead is connected to an internal power supply 502. The internal power supply 502 provides the necessary energy to the frequency generator 504 and power amplifier 506. A ground (GND) lead provides a common ground for the transmitter circuit 404.

At least one frequency band switch (F1/F2) lead is provided, however as mentioned previously, multiple leads, shown as dashed lines, may be provided to select more than two frequency bands. The input signal on the frequency band switch (F1/F2) lead selectively engages a frequency generator 504 to generate one of a plurality of supported frequencies. An external crystal oscillator ($X_{TL}$) lead provides a reference frequency signal from which the frequency generator 504 derives the plurality of supported frequency bands.

The output from the frequency generator 504 is passed to the power amplifier 506, which also receives signals arriving on the DATA lead. The two inputs are combined and amplified according to FCC transmission limits for a selected frequency. The amplified signal is outputted on the power amplifier out ($PA_{OUT}$) lead, which is connected to an antenna. A power amplifier ground ($PA_{GND}$) lead provides the ground for the power amplifier.

Additionally, the transmitter circuit 404 may include an internal buffer (not shown) receiving input via the DATA lead. The buffer, in such an embodiment, is provided to store message data for use in generating additional message signals on each of the supported frequencies. Once all the frequencies have been used for transmitting the message data, a signal can be sent on a reset lead (not shown), which clears the contents of the buffer.

The described embodiments of the present invention are intended to be illustrative rather than restrictive, and are not intended to represent every embodiment of the present invention. Various modifications and variations can be made without departing from the spirit or scope of the invention as set forth in the following claims both literally and in equivalents recognized in law.

What is claimed is:

1. A method for wirelessly transmitting a message over multiple frequencies, said method comprising:
    providing a plurality of carrier frequencies;
    selecting a first carrier frequency from said plurality of carrier frequencies;
    transmitting a signal over said selected carrier frequency using calculated parameters based on said selected carrier frequency, said calculated parameters includes radiated field strength, said radiated field strength being $\leq[41.66\ (\mu V/m)/MHz]*F-7083.33\ \mu V/m$, where F is said selected carrier frequency;
    switching to a next carrier frequency from said plurality of carrier frequencies; and
    repeating said transmitting and switching until all carrier frequencies of said plurality of carrier frequencies have been selected.

2. The method of claim 1, wherein said plurality of carrier frequencies range in frequency between 260 MHz and 470 MHz.

3. A multi-frequency wireless transmitter comprising:
    frequency generating means for generating a plurality of carrier frequencies;
    power means for generating multiple voltage output levels, said multiple voltage output levels being selectable;
    controller means for controlling said power means and said frequency generating means, said controller means being configured for selecting a first frequency of said plurality of carrier frequencies; and
    transmission means for transmitting a message over said selected first frequency, after transmission of said message over said selected first frequency, said controller selects a subsequent frequency from said plurality of carrier frequencies and said transmission means transmits said message over said selected subsequent frequency, said subsequent frequency being different from said first frequency.

4. The multi-frequency wireless transmitter of claim 3, wherein said power means supplies voltage to said frequency generating means, said supplied voltage being varied depending on the frequency of said generated carrier frequency.

5. The multi-frequency wireless transmitter of claim 3, wherein said subsequent frequency selection and said message transmission is repeated until all frequencies of said plurality of carrier frequencies have been selected.

6. The multi-frequency wireless transmitter of claim 3, wherein said transmission means transmits said message at a radiated field strength level, said radiated field strength being $\leq[41.66\ (\mu V/m)MHz]*F-7083.33\ \mu V/m$, where F is said selected carrier frequency.

7. The multi-frequency wireless transmitter of claim 3, wherein said plurality of carrier frequencies are in the RF range.

8. A multi-frequency wireless transmitter comprising:
 a plurality of frequency tuning circuits, each frequency tuning circuit being matched to a unique frequency;
 a data encoder for encoding data, said data encoder outputting a frequency band switch signal corresponding to a selected frequency, said selected frequency being one of said unique frequencies matched to one of said plurality of frequency tuning circuits;
 an RF transmitter circuit configured to receive and prepare said encoded data for transmission on a carrier frequency, said carrier frequency being selectable via a frequency band switch input; and
 an antenna for broadcasting said encoded data on said selected carrier frequency.

9. The multi-frequency wireless transmitter of claim 8, wherein said unique frequencies are discrete frequency bands in the range of 260 MHz to 470 MHz.

10. The multi-frequency wireless transmitter of claim 8, wherein said plurality of frequency tuning circuits is selected by said frequency band switch signal.

11. The multi-frequency wireless transmitter of claim 8, further comprising an energy saver means wherein said RF transmitter circuit is energized only when said RF transmitter circuit is in active use.

12. A multi-frequency RF transmitter circuit for transmitting an RF signal, said transmitter circuit comprising:
 a power supply input for energizing said transmitter circuit;
 a data input for receiving data signals to be transmitted;
 at least one frequency band switch input for selecting one frequency band from a plurality of supported frequency bands;
 an output for outputting an amplified RF signal to an antenna for transmission, said RF signal containing said data signals; and
 a multi-frequency generator, said multi-frequency generator receiving said frequency band switch signal via said at least one frequency band switch input and generating an RF frequency corresponding to said frequency band switch signal.

13. The multi-frequency RF transmitter circuit of claim 12, further comprising a crystal oscillator configured as a frequency reference.

14. The multi-frequency RF transmitter circuit of claim 12, wherein said supported frequency bands are discrete frequencies in the range of 260 MHz to 470 MHz.

15. The multi-frequency RF transmitter circuit of claim 12, further comprising an energy saver means wherein said power supply input energizes said transmitter circuit only when said transmitter circuit is in active use.

* * * * *

UNITED STATES PATENT AND TRADEMARK OFFICE
CERTIFICATE OF CORRECTION

PATENT NO. : 7,636,579 B2  Page 1 of 1
APPLICATION NO. : 11/281199
DATED : December 22, 2009
INVENTOR(S) : Kenneth G. Eskildsen It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1012 days.

Signed and Sealed this

Ninth Day of November, 2010

David J. Kappos
*Director of the United States Patent and Trademark Office*